US012745545B2

(12) United States Patent
Lee et al.

(10) Patent No.: US 12,745,545 B2
(45) Date of Patent: Sep. 22, 2026

(54) COVER WINDOW INCLUDING THE COVER WINDOW HAVING PRINTED LAYER

(71) Applicant: Samsung Display Co., LTD., Yongin-si (KR)

(72) Inventors: Junga Lee, Yongin-si (KR); Tecksoo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 425 days.

(21) Appl. No.: 18/451,228

(22) Filed: Aug. 17, 2023

(65) Prior Publication Data

US 2024/0224730 A1 Jul. 4, 2024

(30) Foreign Application Priority Data

Dec. 28, 2022 (KR) ........................ 10-2022-0186722

(51) Int. Cl.

| | |
|---|---|
| ***H10K 59/80*** | (2023.01) |
| ***H10K 59/12*** | (2023.01) |
| ***H10K 59/126*** | (2023.01) |
| *F21K 9/66* | (2016.01) |
| *G02F 1/1333* | (2006.01) |
| *H10K 102/00* | (2023.01) |

(52) U.S. Cl.

CPC ....... *H10K 59/873* (2023.02); *H10K 59/1201* (2023.02); *H10K 59/126* (2023.02); *F21K 9/66* (2016.08); *G02F 1/133331* (2021.01); *H10K 2102/351* (2023.02)

(58) Field of Classification Search

CPC .. H10K 59/873; H10K 59/126; H10K 59/872; H10K 50/841; G09F 9/30; G09F 1/133331; F21K 9/66

See application file for complete search history.

(56) References Cited

U.S. PATENT DOCUMENTS

| | | | | |
|---|---|---|---|---|
| 4,133,699 | A * | 1/1979 | Meulenberg, Jr. .... | H10F 77/484 136/256 |
| 5,885,714 | A * | 3/1999 | Demeester ............ | B32B 27/306 428/416 |
| 12,024,462 | B2 * | 7/2024 | Hwang ................ | C03C 21/002 |
| 2019/0173050 | A1 * | 6/2019 | Eo ...................... | H10K 59/8731 |

(Continued)

FOREIGN PATENT DOCUMENTS

| | | | | |
|---|---|---|---|---|
| CN | 102402338 | | 12/2013 | |
| EP | 3710896 | B1 * | 9/2021 | ....... B32B 17/10119 |

(Continued)

*Primary Examiner* — Ida M Soward

(74) *Attorney, Agent, or Firm* — Sughrue Mion, PLLC

(57) ABSTRACT

A cover window includes a window substrate including a front surface area, multiple side surface areas surrounding the front surface area, and a rear surface area facing the front surface area, a first functional layer covering the front surface area of the window substrate and a portion of each of the plurality of side surface areas of the window substrate, a second functional layer covering the first functional layer in the front surface area and a portion of the first functional layer in the side surface areas, and a printed layer extending from the side surface areas to a portion of the rear surface area, contacting the second functional layer in the side surface areas, and covering another portion of the first functional layer and the rear surface area of the window substrate.

12 Claims, 12 Drawing Sheets

(56) References Cited

U.S. PATENT DOCUMENTS

| | | | | |
|---|---|---|---|---|
| 2020/0331799 | A1 * | 10/2020 | Seo | B32B 27/281 |
| 2021/0135158 | A1 * | 5/2021 | Min | C03C 21/002 |
| 2022/0371063 | A1 * | 11/2022 | Harada | B09B 3/70 |
| 2023/0107898 | A1 * | 4/2023 | Lee | G06F 1/1656 361/807 |

FOREIGN PATENT DOCUMENTS

| | | | | | |
|---|---|---|---|---|---|
| KR | 10-1707429 | | | 2/2017 | |
| KR | 10-2067931 | | | 1/2020 | |
| KR | 20210059146 | A | * | 5/2021 | H10K 59/873 |
| KR | 10-2395770 | | | 5/2022 | |
| WO | WO-2017208995 | A1 | * | 12/2017 | G09F 9/00 |

* cited by examiner

COVER WINDOW INCLUDING THE COVER WINDOW HAVING PRINTED LAYER

CROSS REFERENCE TO RELATED APPLICATION(S)

This application claims priority to and benefits of Korean Patent Application No. 10-2022-0186722 under 35 USC § 119, filed on Dec. 28, 2022, in the Korean Intellectual Property Office (KIPO), the entire contents of which are incorporated herein by reference.

BACKGROUND

1. Technical Field

Embodiments provide a cover window, a manufacturing method of the cover window, and a display device including the cover window.

2. Description of the Related Art

With the development of information technology, the importance of a display device, which is a connection medium between a user and information, has been highlighted. For example, the use of display devices such as liquid crystal display device ("LCD"), organic light emitting display device ("OLED"), plasma display device ("PDP"), quantum dot display device, or the like is increasing.

The display device may include a cover window and a display panel. The cover window may be disposed on the display panel and may protect the display panel. The cover window may be divided into a display area where an image is displayed by the display panel and a non-display area adjacent to the display area. A light blocking member (e.g., light blocking ink) may be formed (e.g., printed) on the non-display area of the cover window to partially block light emitted from the display panel.

SUMMARY

Embodiments provide a cover window with improved ink overflow.

Embodiments provide a manufacturing method of the cover window.

Embodiments provide a display device including the cover window.

A cover window according to an embodiment of the disclosure may include a window substrate including a front surface area, a plurality of side surface areas surrounding the front surface area, and a rear surface area facing the front surface area, a first functional layer covering the front surface area of the window substrate and a portion of each of the plurality of side surface areas of the window substrate, a second functional layer covering the first functional layer in the front surface area and a portion of the first functional layer in the plurality of side surface areas, and a printed layer extending from the plurality of side surface areas to a portion of the rear surface area, contacting the second functional layer in the plurality of side surface areas, and covering another portion of the first functional layer and the rear surface area of the window substrate.

In an embodiment, the first functional layer may include an inorganic material.

In an embodiment, the first functional layer may include at least one of $SiO_2$ and $Al_2O_3$.

In an embodiment, the second functional layer may include an anti-fingerprint coating layer.

In an embodiment, each of the first functional layer and the second functional layer may have a uniform thickness.

In an embodiment, a thickness of the first functional layer may be in a range of about 5 nanometers to about 30 nanometers.

In an embodiment, the printed layer may not extend to the front surface area.

In an embodiment, the printed layer may include a plurality of sub-printed layers, and the plurality of sub-printed layers may be stacked on each other.

In an embodiment, the plurality of side surface areas of the window substrate may include a curved surface in a cross-sectional view.

A manufacturing method of a cover window according to an embodiment of the disclosure may include forming a window substrate including a front surface area, a plurality of side surface areas surrounding the front surface area, and a rear surface area facing the front surface area, forming a first functional layer covering the front surface area of the window substrate and a portion of each of the plurality of side surface areas of the window substrate, forming a second functional layer on the first functional layer in the front surface area and a portion of the first functional layer in the plurality of side surface areas, and forming a printed layer extending from the plurality of side surface areas to a portion of the rear surface area, contacting the second functional layer in the plurality of side surface areas, and covering another portion of the first functional layer and the rear surface area of the window substrate.

In an embodiment, the forming of the second functional layer may be performed after the forming of the first functional layer, and the forming of the printed layer may be performed after the forming of the second functional layer.

In an embodiment, the first functional layer may include an inorganic material.

In an embodiment, the first functional layer may include at least one of $SiO_2$ and $Al_2O_3$.

In an embodiment, the second functional layer may include an anti-fingerprint coating layer.

In an embodiment, the first functional layer may be formed to have a thickness in a range of about 5 nanometers to about 30 nanometers.

In an embodiment, the plurality of side surface areas of the window substrate may include a curved surface in a cross-sectional view.

A display device according to an embodiment of the disclosure may include a cover window, a display panel disposed under the cover window, and an adhesive attaching the cover window to the display panel. The cover window may include a window substrate including a front surface area, a plurality of side surface areas surrounding the front surface area, and a rear surface area facing the front surface area, a first functional layer covering the front surface area of the window substrate and a portion of each of the plurality of side surface area of the window substrate, a second functional layer covering the first functional layer in the front surface area and a portion of the first functional layer in the plurality of side surface areas, and a printed layer extending from the plurality of side surface areas to a portion of the rear surface area, contacting the second functional layer in the plurality of side surface areas, and covering another portion of the first functional layer and the rear surface area of the window substrate. The adhesive may cover at least a portion of the printed layer in the plurality of side surface areas and the rear surface area.

In an embodiment, the first functional layer may include at least one of $SiO_2$ and $Al_2O_3$, and the second functional layer may include an anti-fingerprint coating layer.

In an embodiment, the plurality of side surface areas of the window substrate may include a curved surface in a cross-sectional view.

A cover window according to an embodiment of the disclosure may include a second functional layer disposed on a first functional layer in a front surface area and a plurality of side surface areas of a window substrate. The cover window may further include a printed layer contacting the second functional layer in the plurality of side surface areas of the window substrate.

As the second functional layer includes a material having a low surface energy, the printed layer may not be disposed on the second functional layer. The printed layer may not extend to the front surface area where the second functional layer is disposed. As a result, a phenomenon in which ink overflows to a front surface of the cover window may be improved. In other words, a phenomenon in which ink overflows to the front surface area of the window substrate may be improved.

The cover window according to an embodiment of the disclosure may include the first functional layer disposed on the front surface area and the plurality of side surface areas of the window substrate.

As the first functional layer includes a material having a high surface energy, adhesive strength between the window substrate and the printed layer may be enhanced.

BRIEF DESCRIPTION OF THE DRAWINGS

Illustrative, non-limiting embodiments will be more clearly understood from the following detailed description in conjunction with the accompanying drawings.

Figure 1:
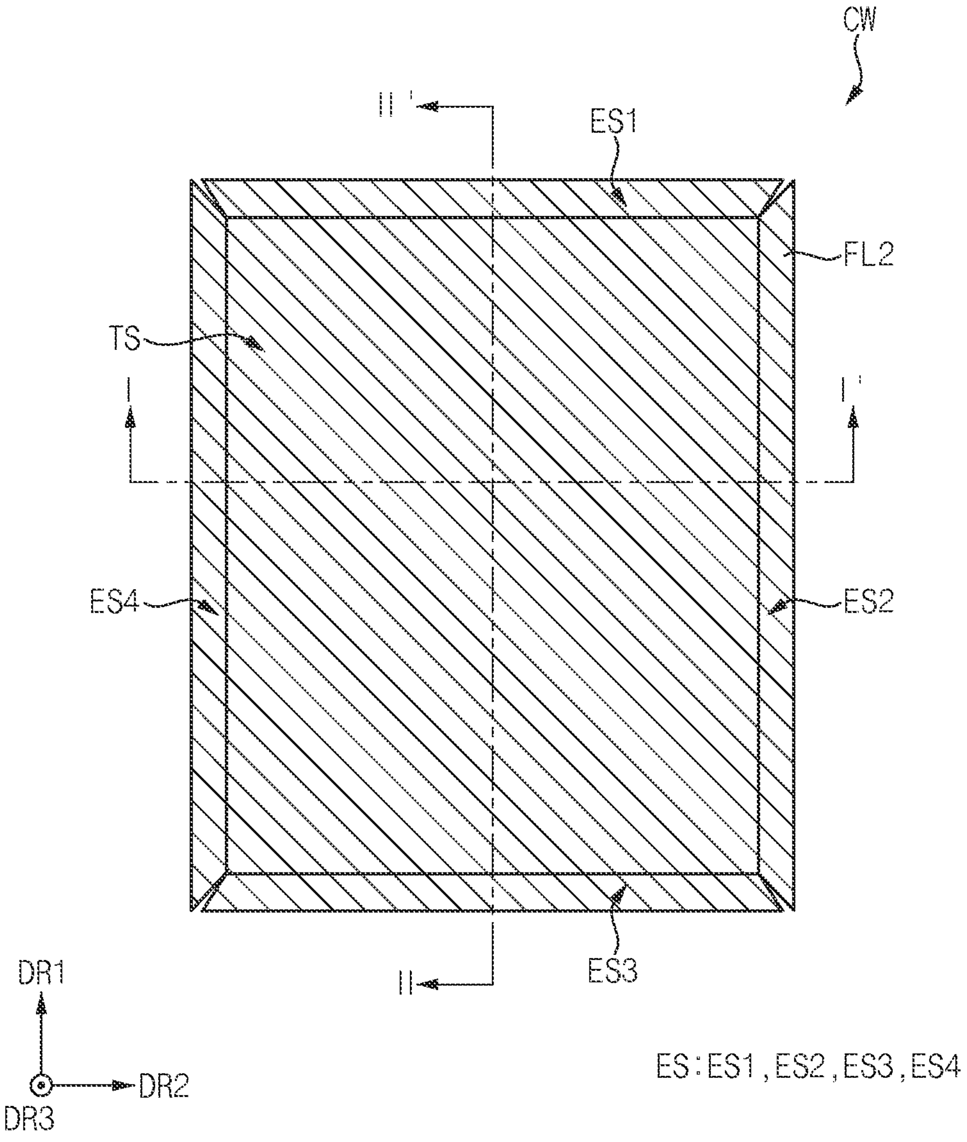
FIG. 1 is a schematic plan view illustrating a cover window according to an embodiment of the disclosure.

Since the drawings in FIGS. 1 to 12 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "under," "lower," "upper," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another.

The display surface may be parallel to a surface defined by a first direction DR1 and a second direction DR2. A normal direction of the display surface, i.e., a thickness direction of the display device DD, may indicate a third direction DR3. In this specification, an expression of "when viewed from a plane or on a plane" may represent a case when viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in detail with reference to the accompanying drawings. The same reference numerals are used for the same components in the drawings, and redundant descriptions of the same components will be omitted.

Figure 2:
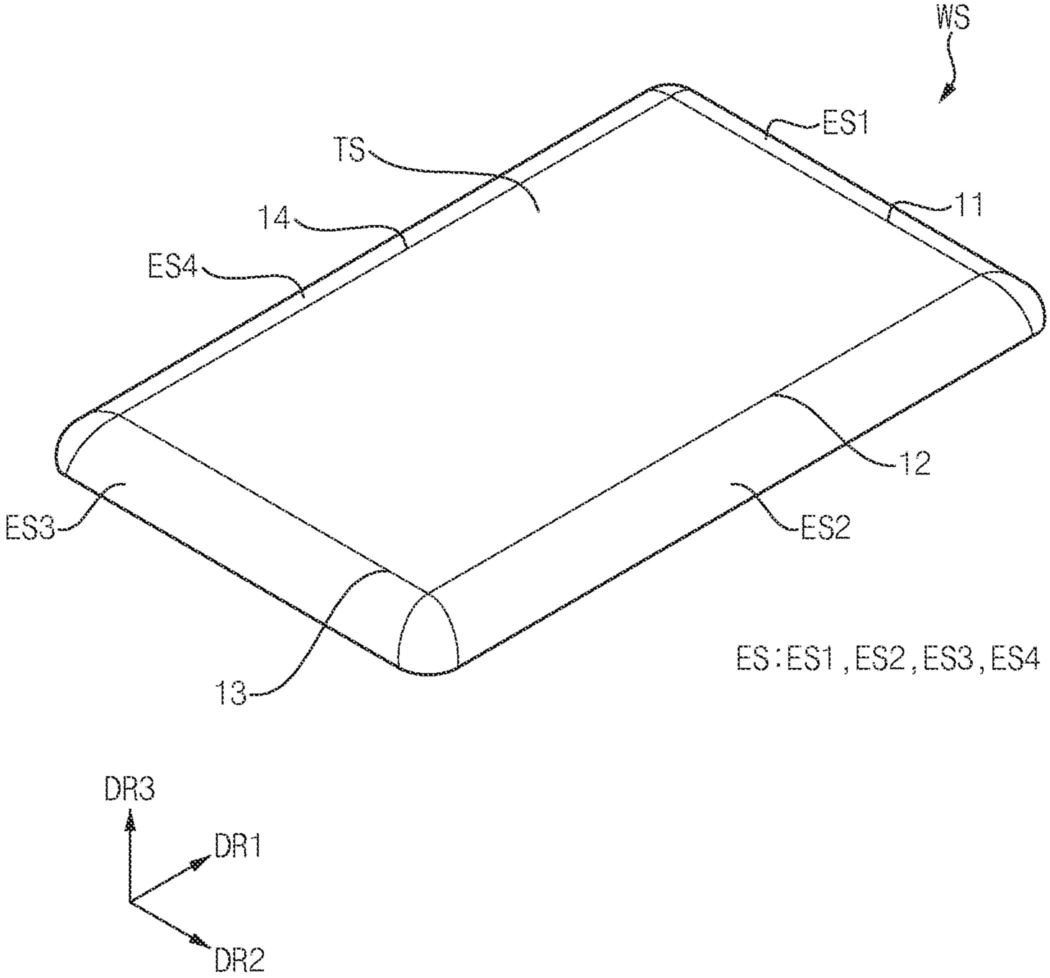
FIG. 2 is a schematic perspective view illustrating a window substrate included in the cover window of FIG. 1.
Figure 3:
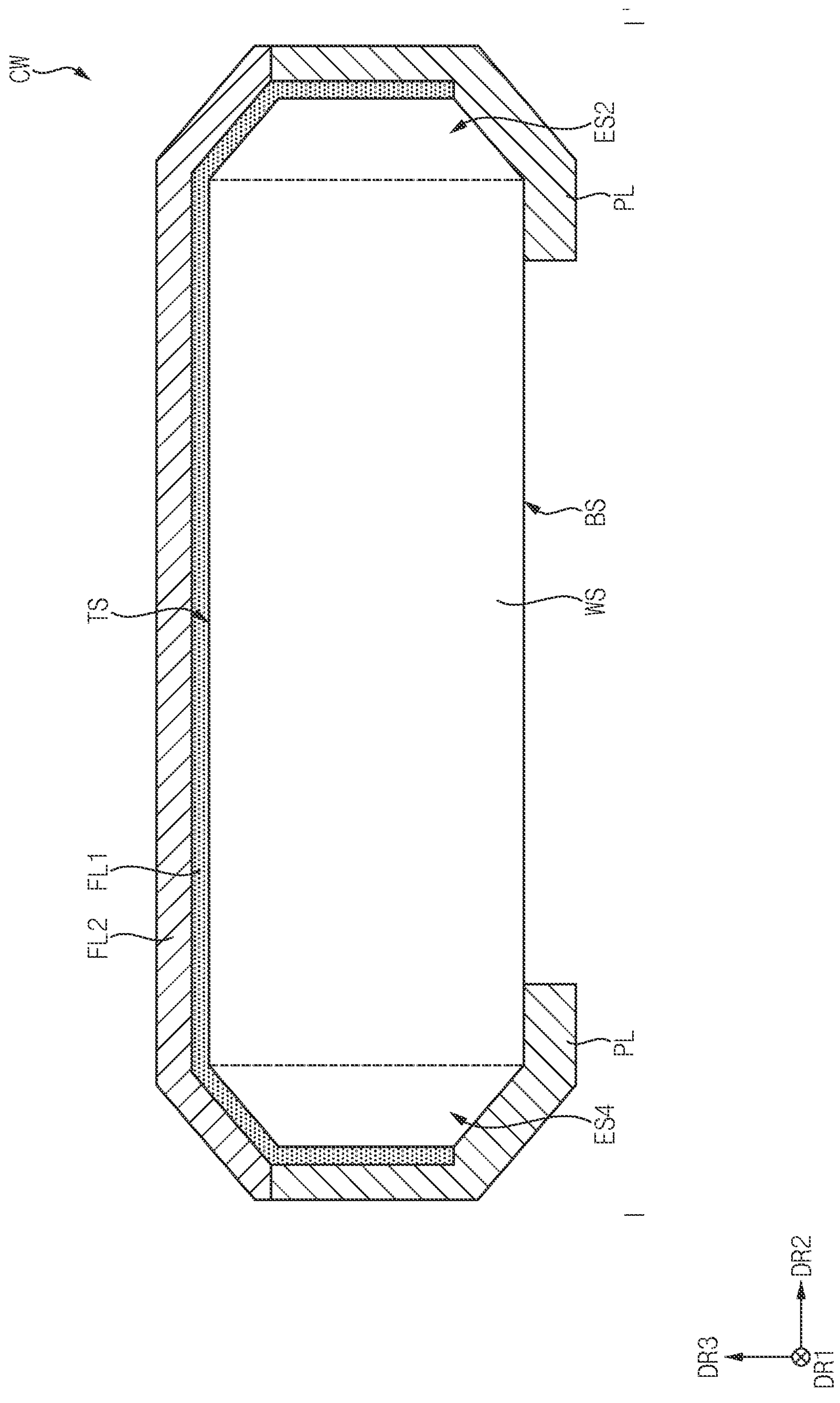
FIG. 3 is a schematic cross-sectional view taken along line I-I' of FIG. 1.
Figure 4:
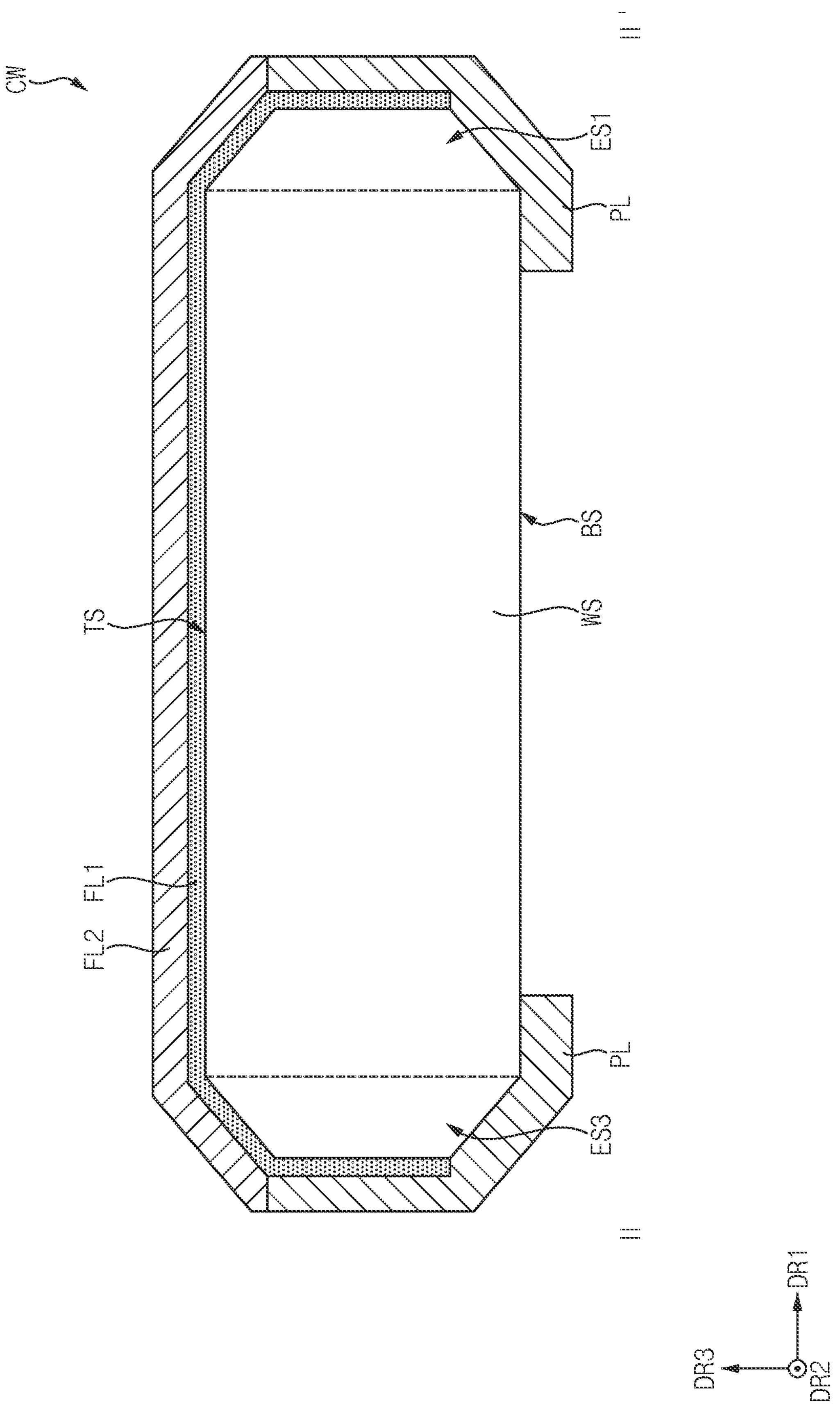
FIG. 4 is a schematic cross-sectional view taken along line II-II' of FIG. 1.

FIG. 1 is a schematic plan view illustrating a cover window according to an embodiment of the disclosure. FIG. 2 is a schematic perspective view illustrating a window substrate included in the cover window of FIG. 1. FIG. 3 is a schematic cross-sectional view taken along line I-I' of FIG. 1. FIG. 4 is a schematic cross-sectional view taken along line II-II' of FIG. 1.

In this specification, a plane may be defined by a first direction DR1 and a second direction DR2 intersecting the first direction DR1. For example, the first direction DR1 and the second direction DR2 may be perpendicular to each other. A direction normal to the plane, for example, a thickness direction of a cover window CW may be a third direction DR3. The third direction DR3 may be perpendicular to each of the first direction DR1 and the second direction DR2.

Referring to FIGS. 1, 2, 3, and 4, the cover window CW according to an embodiment of the disclosure may include a window substrate WS, a first functional layer FL1, a second functional layer FL2, and a printed layer PL.

The window substrate WS may include a transparent glass, a plastic, or the like. The window substrate WS may be a transparent resin substrate. For example, the transparent resin substrate may be a polyimide substrate or the like, and may include a first organic layer, a first barrier layer, a second organic layer, and the like. In another embodiment, the window substrate WS may be a quartz substrate, a synthetic quartz substrate, a calcium fluoride substrate, a fluorine-doped ("F-doped") quartz substrate, a soda-lime glass substrate, a non-alkali glass substrate, the like, or a combination thereof. The window substrate WS may transmit an image provided by a display panel (see, e.g., a display panel DP of FIG. 9) to be described below so that users view the image.

As illustrated in FIG. 2, the window substrate WS may include a front surface area (or a top surface area) TS and multiple side surface areas ES. Although not illustrated in FIG. 2, the window substrate WS may further include a rear surface area (or a bottom surface area) BS. The side surface areas ES may include a first side surface area ES1, a second side surface area ES2, a third side surface area ES3, and a fourth side surface area ES4.

The window substrate WS may include a transparent and flat surface in the front surface area TS. The front surface area TS of the window substrate WS may include a first side 11, a second side 12, a third side 13, and a fourth side 14. For example, a shape of the window substrate WS may be a rectangle in the front surface area TS in a plan view. In another embodiment, the shape of the window substrate WS may be a rectangle with rounded corners in the front surface area TS in a plan view. The first side 11 and the third side 13 may face each other and extend in parallel to each other (for example, in the second direction DR2). Each of the second side 12 and the fourth side 14 may be disposed between the first side 11 and the third side 13. The second side 12 and the fourth side 14 may face each other and extend in parallel to each other (for example, in the first direction DR1).

The window substrate WS may include four side surface areas ES each contacting the first side 11, the second side 12, the third side 13, and the fourth side 14. The first side surface area ES1 may contact the front surface area TS on the first side 11. The second side surface area ES2 may contact the front surface area TS on the second side 12. The third side surface area ES3 may contact the front surface area TS on the third side 13. The fourth side surface area ES4 may contact the front surface area TS on the fourth side 14.

The rear surface area (see, e.g., a rear surface area BS of FIG. 3) of the window substrate WS may face the front surface area TS of the window substrate WS. The window substrate WS may include a transparent and flat surface in the rear surface area BS. A shape of the window substrate WS may be a rectangle in the rear surface area BS in a plan view. In another embodiment, the shape of the window substrate WS may be a rectangle with rounded corners in the rear surface area BS in a plan view. The window substrate WS in the rear surface area BS and the window substrate WS in the front surface area TS may be formed in a same shape.

The front surface area TS, the rear surface area BS, the first functional layer FL1, the second functional layer FL2, and the printed layer PL of FIG. 4 may correspond to the front surface area TS, the rear surface area BS, the first functional layer FL1, the second functional layer FL2, and the printed layer PL of FIG. 3, respectively. Each of the first side surface area ES1, the second side surface area ES2, the third side surface area ES3, and the fourth side surface area ES4 may have substantially the same or symmetrical shapes. Therefore, hereinafter, the description will be focused on the fourth side surface area ES4 of the window substrate WS. Descriptions of the fourth side surface area ES4 may be same as or similar to descriptions of the first side surface area ES1, the second side surface area ES2, and the third side surface area ES3. Accordingly, descriptions of the cover window CW of FIG. 4 may be equally applied to descriptions of the cover window CW of FIG. 3.

The window substrate WS may include a transparent glass, a plastic, or the like. As illustrated in FIG. 3, a shape of the window substrate WS may be an octagon in a cross-sectional view. However, the disclosure is not limited thereto, and the shape of the window substrate WS may be a rectangle with rounded corners in a cross-sectional view. The embodiment of the window substrate WS with a rectangular shape with rounded corners will be described below with reference to FIG. 12.

The first functional layer FL1 may cover the window substrate WS in the front surface area TS. The first functional layer FL1 may be disposed on the window substrate WS in the fourth side surface area ES4. The first functional layer FL1 may include a material having a high surface energy. In an embodiment, the first functional layer FL1 may include an inorganic material. For example, the first functional layer FL1 may include silicon dioxide ($SiO_2$), aluminum oxide ($Al_2O_3$), the like, or a combination thereof. In an embodiment, the first functional layer FL1 may have a uniform thickness. For example, the first functional layer FL1 may have a thickness in a range of about 5 nanometers to about 30 nanometers.

The second functional layer FL2 may cover the first functional layer FL1 in the front surface area TS. The second functional layer FL2 may cover a portion of the first functional layer FL1 in the fourth side surface area ES4. The second functional layer FL2 may include a material having a low surface energy. In an embodiment, the second functional layer FL2 may include an anti-fingerprint ("AF") coating layer. The AF coating layer may be formed by printing, coating, or depositing a water-repellent and oil-repellent coating material including a fluorine group or the like on a substrate. In an embodiment, the second functional layer FL2 may have a uniform thickness. For example, the second functional layer FL2 may have a thickness in a range of about 10 nanometers to about 40 nanometers.

The printed layer PL may be disposed to contact the second functional layer FL2 in the fourth side surface area ES4. The printed layer PL may extend from the fourth side surface area ES4 to a portion of the rear surface area BS, and may be disposed on the window substrate WS in the rear surface area BS. The printed layer PL may cover another portion of the first functional layer FL1 in the fourth side surface area ES4. For example, the printed layer PL may cover a portion of the first functional layer FL1 on which the second functional layer FL2 is not disposed in the fourth side surface area ES4.

The printed layer PL may include an inorganic material and/or an organic material. For example, the organic material may include a photoresist, a polyacryl-based resin, a polyimide-based resin, a polyamide-based resin, a siloxane-based resin, an acryl-based resin, an epoxy-based resin, the like, or a combination thereof.

The printed layer PL may block external light. In an embodiment, the printed layer PL may include an inorganic material and/or an organic material including a light blocking material in black color. For example, the light blocking material may include a black pigment, a black dye, carbon black, the like, or a combination thereof. In embodiments, the printed layer PL may have various colors other than black color.

The printed layer PL may be formed by various methods such as an ink method, a deposition method, a screen printing method, or the like. The printed layer PL may have a thickness in a range of about 5 micrometers to about 10 micrometers depending on the printing method. The printed layer PL may lack a light blocking property in case that a bright color such as white or the like is applied, and light may transmit into the inside of the window substrate WS. To prevent this, the printed layer PL having a thickness (e.g., a desired thickness) may be formed by stacking a material of the printed layer PL multiple times.

In a conventional cover window (corresponding to CW), in case that the printed layer PL is formed on the side surface areas ES (see, e.g., the second side surface area ES2 and the fourth side surface area ES4 of FIG. 3, and the first side surface area ES1 and the third side surface area ES3 of FIG. 4) of the window substrate WS, there is a problem in that the printed layer PL extends to the front surface area TS of the window substrate WS. For example, ink may overflow to a front surface of the cover window (corresponding to CW). In a process of removing the printed layer PL disposed on the front surface area TS of the window substrate WS, the printed layer PL formed on the side surface areas ES may be damaged.

To prevent the problem of extending the printed layer PL to the front surface area TS of the window substrate WS, the cover window CW according to an embodiment of the disclosure may include the second functional layer FL2 disposed on the front surface area TS and a portion of the side surface areas ES. As the second functional layer FL2 includes a material having a low surface energy such as the AF coating layer or the like, the printed layer PL may not be disposed on the second functional layer FL2. For example, the printed layer PL may not extend to the front surface area TS where the second functional layer FL2 is disposed. Accordingly, ink may not overflow to the front surface area TS of the window substrate WS.

The cover window CW according to an embodiment of the disclosure may include the first functional layer FL1 disposed on the window substrate WS in the side surface areas ES. As the first functional layer FL1 includes a material having a high surface energy, adhesive strength between the window substrate WS and the printed layer PL may be enhanced.

FIGS. 5, 6, 7, and 8 are schematic cross-sectional views illustrating a manufacturing method of a cover window CW according to an embodiment of the disclosure. For example, FIGS. 5, 6, 7, and 8 are schematic cross-sectional views taken along line I-I' of FIG. 1. As described above, the first side surface area (see, e.g., the first side surface area ES1 of FIG. 4), the second side surface area (see, e.g., the second side surface area ES2 of FIG. 3), the third side surface area (see, e.g., the third side surface area ES3 of FIG. 4), and the fourth side surface area (see, e.g., the fourth side surface area ES4 of FIG. 3) may have substantially same or symmetrical shapes. Therefore, hereinafter, the description will be focused on the fourth side surface area ES4 of the window substrate WS.

Figure 5:
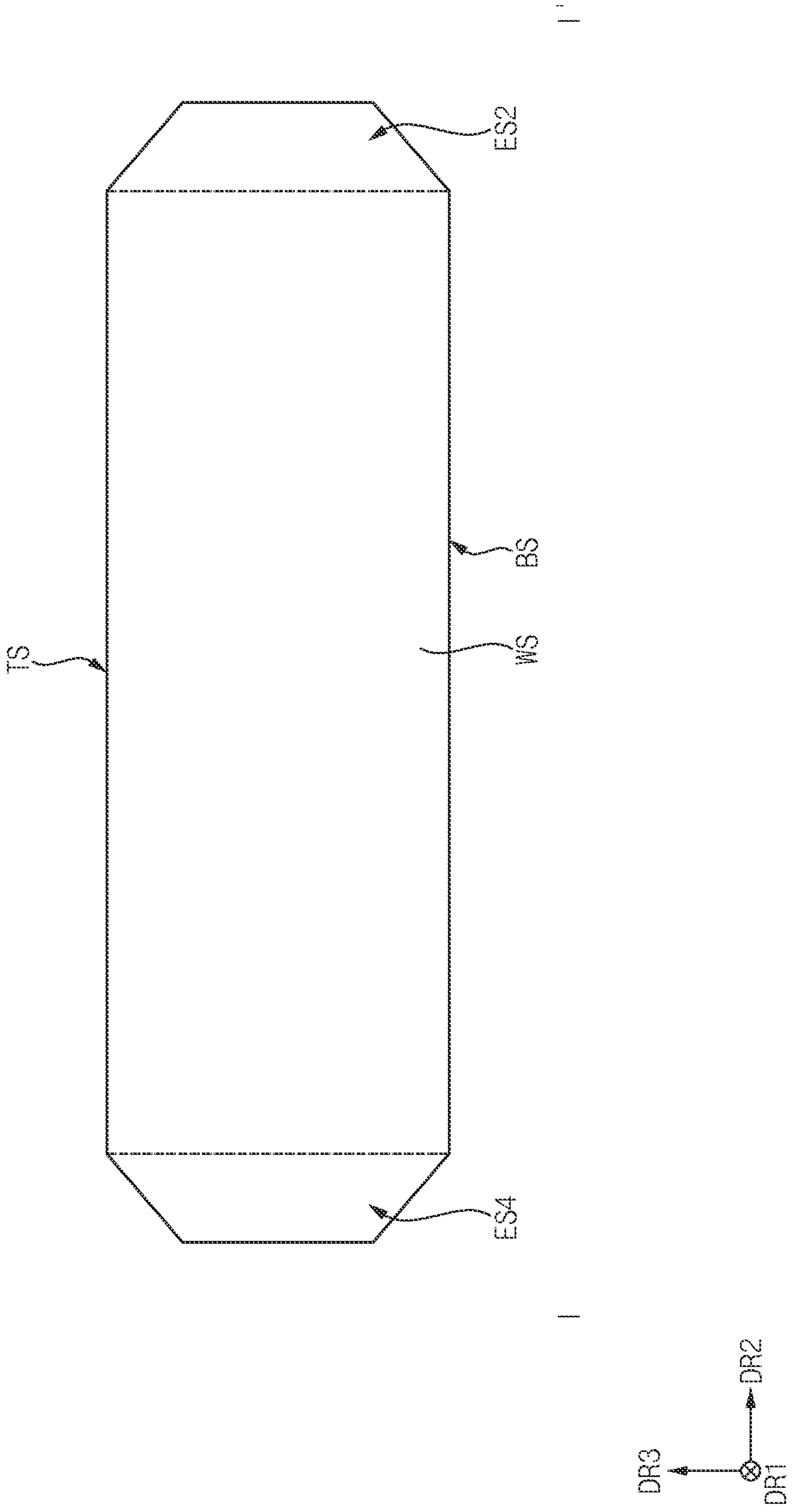
FIGS. 5, 6, 7, and 8 are schematic cross-sectional views illustrating a manufacturing method of a cover window according to an embodiment of the disclosure.

Referring to FIG. 5, the window substrate WS including the front surface area TS, the rear surface area BS, the second side surface area ES2, and the fourth side surface area ES4 may be formed. The window substrate WS may include a transparent glass, a plastic, or the like. The window substrate WS may include a transparent resin. For example, the substrate may include polyimide or the like. A shape of the window substrate WS may be an octagon in a cross-sectional view. However, the disclosure is not limited thereto, and the shape of the window substrate WS may be a rectangle with rounded corners in a cross-sectional view.

Figure 6:
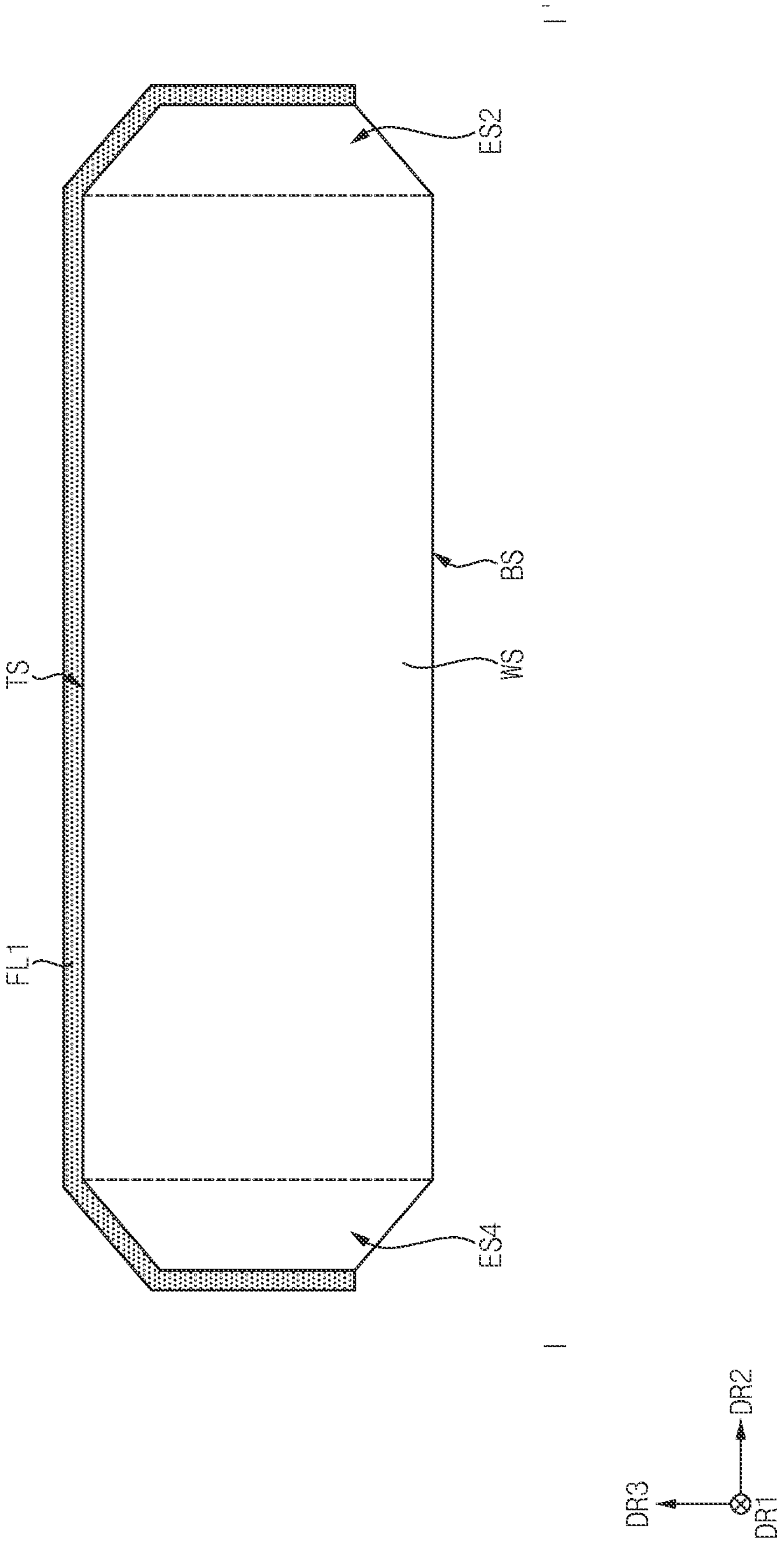

Referring to FIG. 6, the first functional layer FL1 may be formed on the window substrate WS in the front surface area TS. The first functional layer FL1 may cover the window substrate WS in the front surface area TS. The first functional layer FL1 may be formed on the window substrate WS in the fourth side surface area ES4. The first functional layer FL1 may include a material having a high surface energy. In an embodiment, the first functional layer FL1 may include an inorganic material. For example, the first functional layer FL1 may include silicon dioxide ($SiO_2$), aluminum oxide ($Al_2O_3$), the like, or a combination thereof. In an embodiment, the first functional layer FL1 may have a uniform thickness. For example, the first functional layer FL1 may have a thickness in a range of about 5 nanometers to about 30 nanometers.

Figure 7:
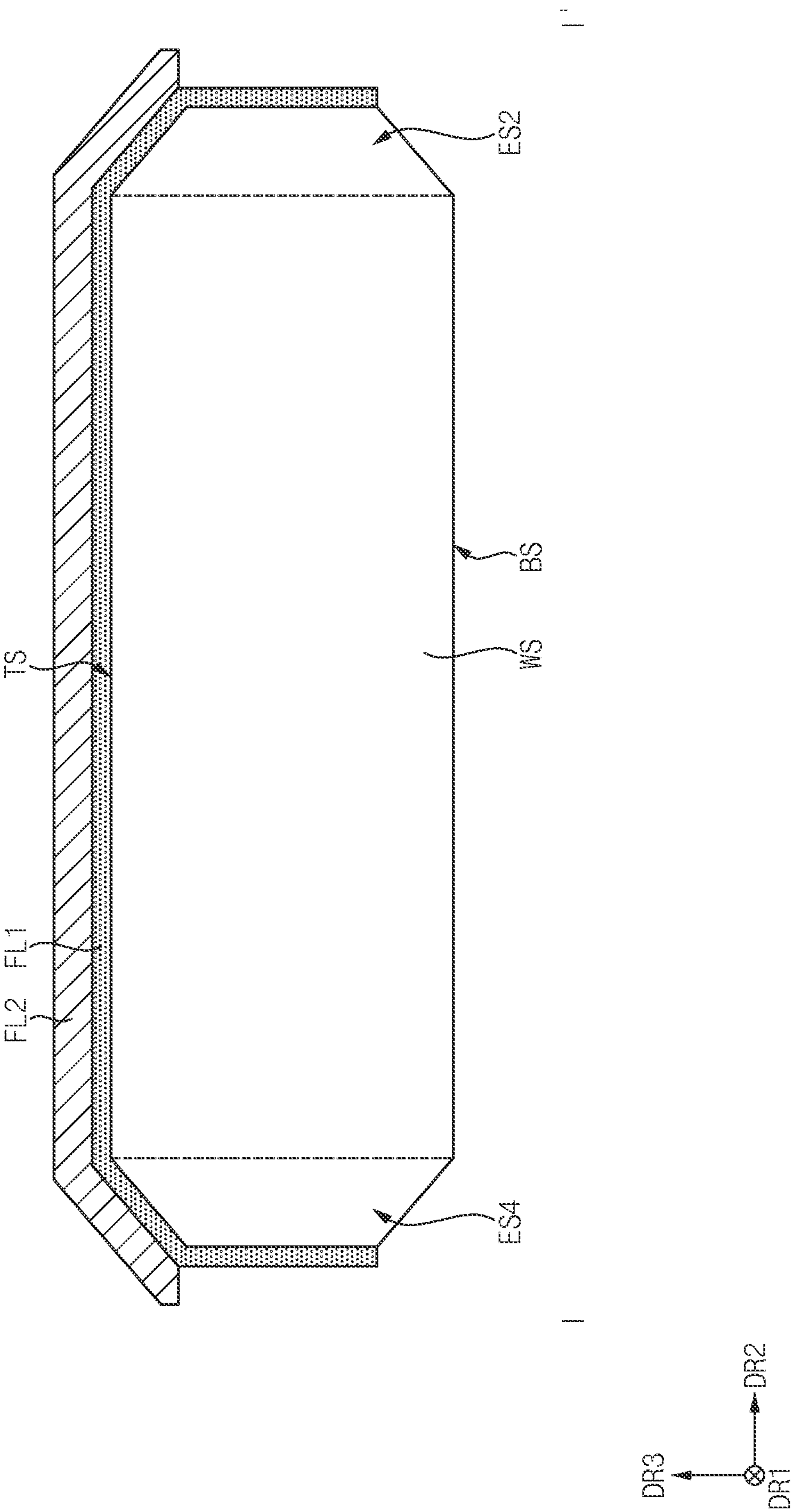

Referring to FIG. 7, the second functional layer FL2 may be formed on the first functional layer FL1 in the front surface area TS. For example, the second functional layer FL2 may cover the first functional layer FL1 in the front surface area TS. The second functional layer FL2 may be formed to cover a portion of the first functional layer FL1 in the fourth side surface area ES4. The second functional layer FL2 may include a material having a low surface energy. In an embodiment, the second functional layer FL2 may include an anti-fingerprint ("AF") coating layer. The AF coating layer may be formed by printing, coating, or depositing a water-repellent and oil-repellent coating material including a fluorine group or the like on a substrate. In an embodiment, the second functional layer FL2 may have a uniform thickness. For example, the second functional layer FL2 may have a thickness in a range of about 10 nanometers to about 40 nanometers.

In an embodiment, the second functional layer FL2 may be formed after the first functional layer FL1 is formed. In case that the cover window CW does not include the first functional layer FL1, as the second functional layer FL2 includes a material having a low surface energy, the second functional layer FL2 may not be formed (e.g., readily formed) on the window substrate WS. For example, in order to readily form the second functional layer FL2, the first functional layer FL1 may be first formed on the window substrate WS. As the first functional layer FL1 includes a material having a high surface energy, the second functional layer FL2 may be disposed on the first functional layer FL1.

Figure 8:
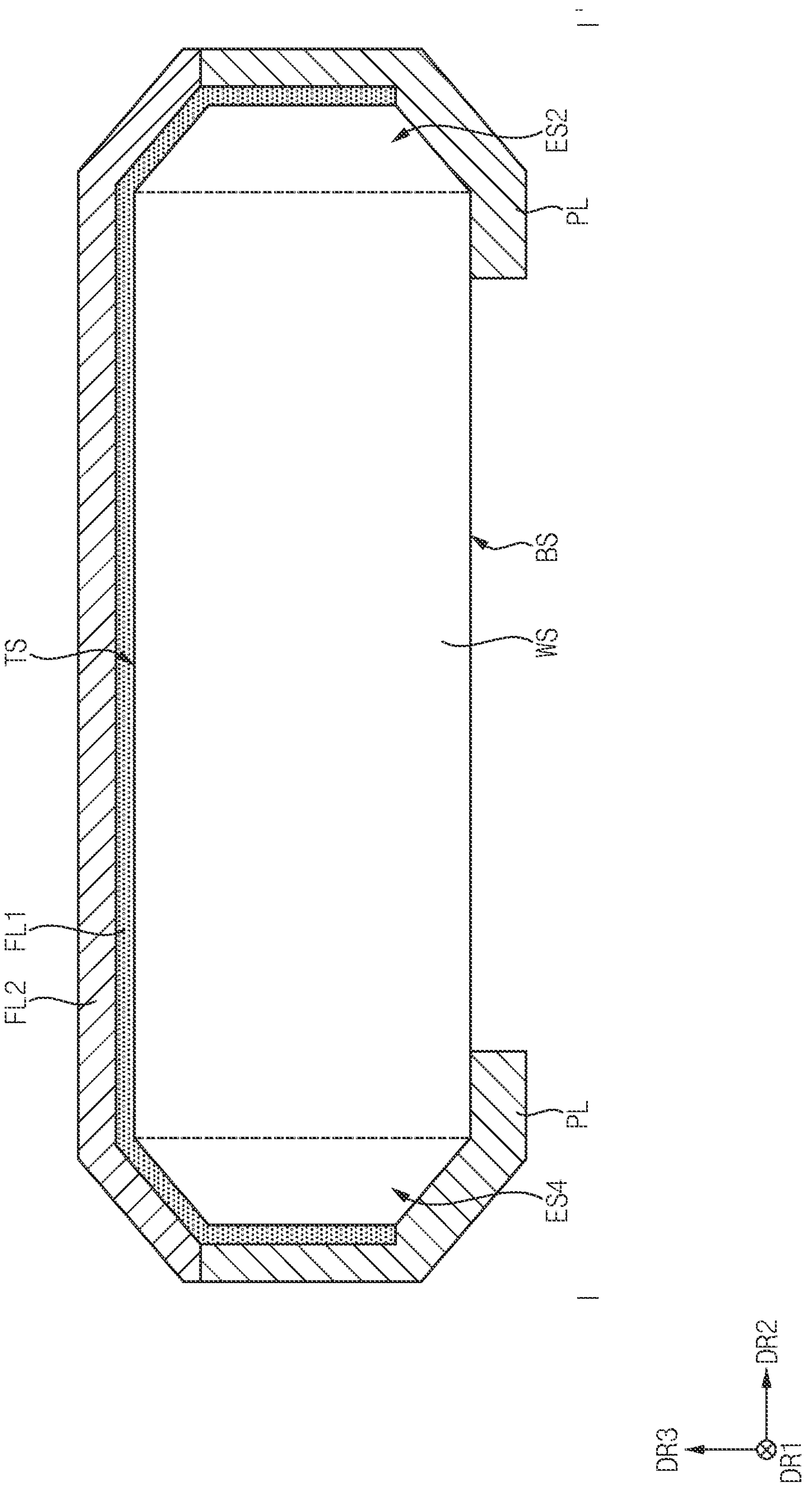

Referring to FIG. 8, the printed layer PL may be formed to contact the second functional layer FL2 in the fourth side surface area ES4. For example, the printed layer PL may be formed on the first functional layer FL1 and the window substrate WD in the fourth side surface area ES4. The printed layer PL may extend from the fourth side surface area ES4 to a portion of the rear surface area BS, and may be formed on the window substrate WS in the rear surface area BS. The printed layer PL may be formed to cover another portion of the first functional layer FL1 in the fourth side surface area ES4. For example, the printed layer PL may cover a portion of the first functional layer FL1 on which the second functional layer FL2 is not disposed in the fourth side surface area ES4.

The printed layer PL may include an inorganic material and/or an organic material. For example, the organic material may include a photoresist, a polyacryl-based resin, a polyimide-based resin, a polyamide-based resin, a siloxane-based resin, an acryl-based resin, an epoxy-based resin, the like, or a combination thereof.

The printed layer PL may block external light. In an embodiment, the printed layer PL may include an inorganic material and/or an organic material including a light blocking material in black color. For example, the light blocking material may include a black pigment, a black dye, carbon black, the like, or a combination thereof. The printed layer PL may be formed by various methods such as an ink method, a deposition method, a screen printing method, or the like. The printed layer PL may have a thickness in a range of about 5 micrometers to about 10 micrometers depending on a printing method.

In an embodiment, the printed layer PL may be formed after the second functional layer FL2 is formed. As the second functional layer FL2 includes a material having a low surface energy, the printed layer PL may not be disposed on the second functional layer FL2. The printed layer PL may not extend to the front surface area TS where the second functional layer FL2 is disposed. For example, in order to solve the problem that the printed layer PL is formed on the front surface area TS of the window substrate WS, the printed layer PL may be formed after the second functional layer FL2 is formed.

Figure 9:
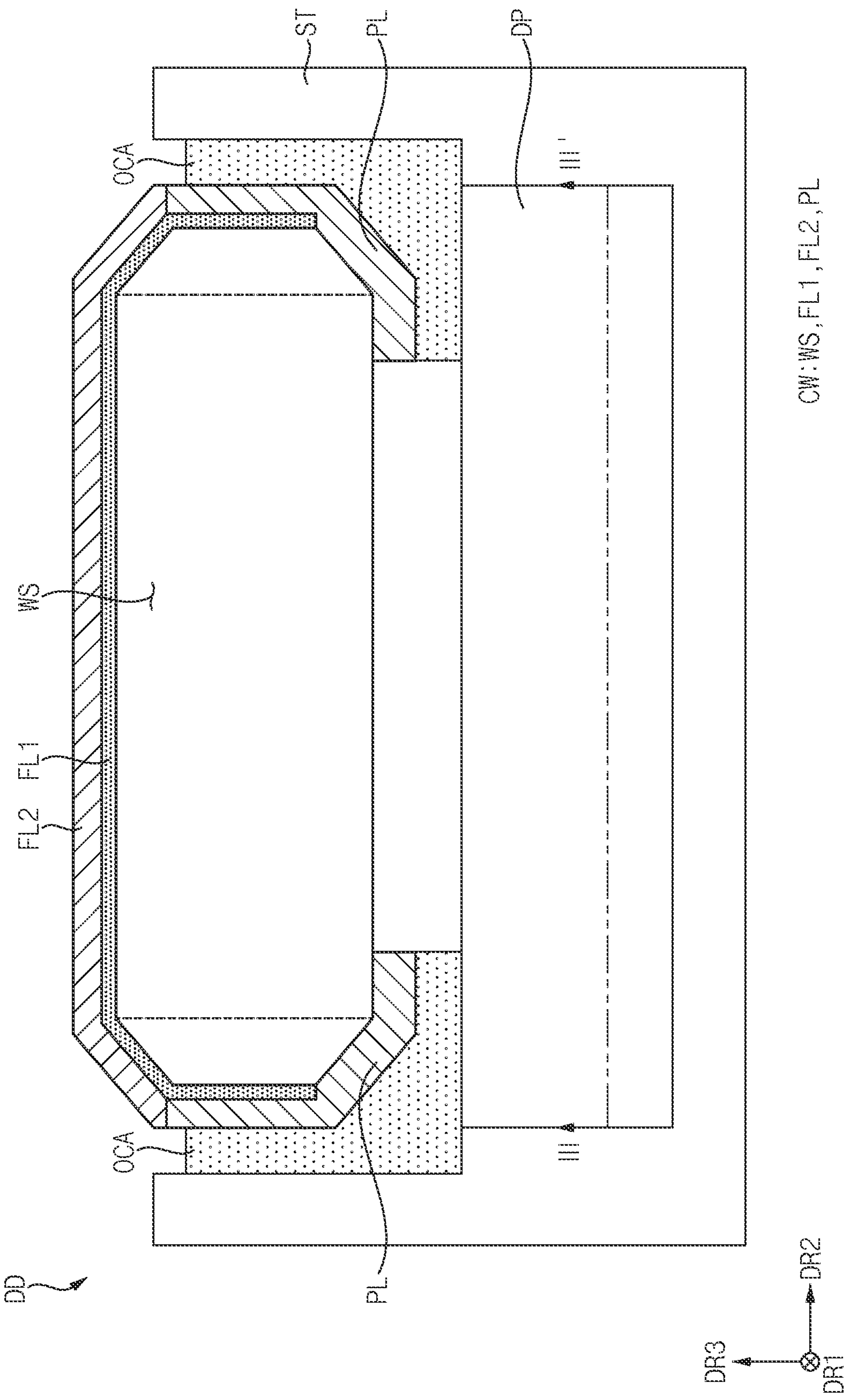
FIG. 9 is a schematic cross-sectional view illustrating a display device according to an embodiment of the disclosure.
Figure 10:
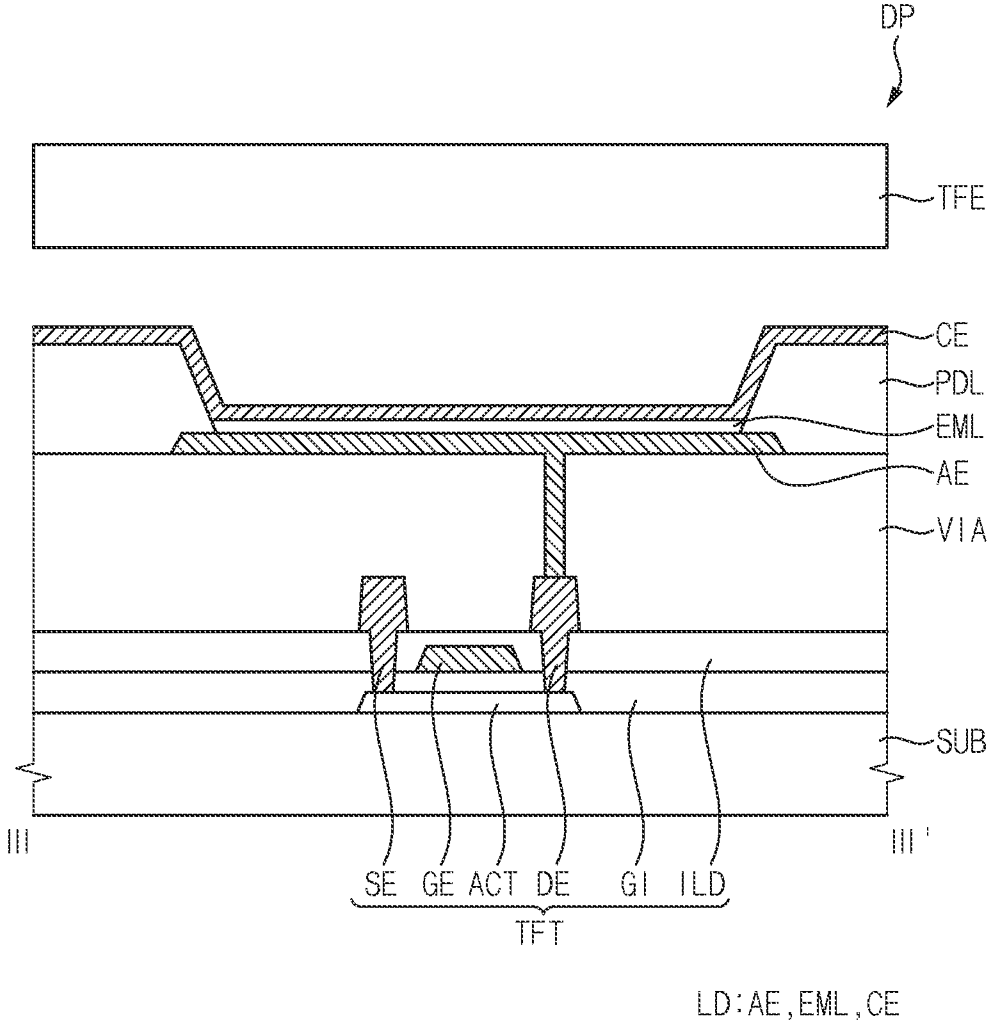
FIG. 10 is a schematic cross-sectional view taken along line III-III' of FIG. 9.

FIG. 9 is a schematic cross-sectional view illustrating a display device DD according to an embodiment of the disclosure. For example, FIG. 9 is a schematic cross-sectional view illustrating the display device DD including the cover window CW of FIG. 1. FIG. 10 is schematic a cross-sectional view taken along line III-III' of FIG. 9. For example, FIG. 10 is a schematic cross-sectional view illustrating a display panel DP of FIG. 9. Hereinafter, a detailed description of the cover window CW will be omitted.

Referring to FIG. 9, the display device DD according to an embodiment of the disclosure may include the display panel DP, an adhesive OCA, the cover window CW, and a set ST.

The cover window CW may include the window substrate WS, the first functional layer FL1, the second functional layer FL2, and the printed layer PL. The cover window CW illustrated in FIG. 9 may correspond to the cover window CW illustrated in FIG. 1, a cover window CW2 illustrated in FIG. 11, or a cover window CW3 illustrated in FIG. 12.

The adhesive OCA may cover a portion of the printed layer PL of the cover window CW. For example, the adhesive OCA may be disposed on a side and a bottom of the cover window CW to provide adhesive strength to the cover window CW. The adhesive OCA may attach the cover window CW to the display panel DP. The adhesive OCA may be a transparent adhesive such as a pressure sensitive adhesive film ("PSA film"), an optically clear adhesive film ("OCA film"), an optically clear resin ("OCR"), the like, or a combination thereof. A material of the adhesive OCA and a material of the window substrate WS may have substantially a same refractive index. Accordingly, the adhesive OCA may improve visibility by reducing luminance loss of the display device DD and removing optical noise from external light. In an embodiment, the window substrate WS may include a glass, a polymer resin such as a PMMA-based material, or the like, and the adhesive OCA may include an acryl-based optically clear adhesive tape or the like.

The display panel DP may be disposed under the cover window CW. The display panel DP may be coupled to the cover window CW by the adhesive OCA.

The display panel DP and the cover window CW may be accommodated in the set ST.

Referring to FIG. 10, the display panel DP may include a base substrate SUB, a thin film transistor TFT, a via insulating layer VIA, a light emitting element LD, a pixel defining layer PDL and an encapsulation layer TFE. The thin film transistor TFT may include an active layer ACT, a gate insulating layer GI, a gate electrode GE, an interlayer insulating layer ILD, a source electrode SE, and a drain electrode DE. The light emitting element LD may include a lower electrode AE, a light emitting layer EML, and an upper electrode CE.

The base substrate SUB may include a transparent material, an opaque material, or the like. The base substrate SUB may be a transparent resin substrate. For example, the transparent resin substrate may be a polyimide substrate or the like, and may include a first organic layer, a first barrier layer, a second organic layer, and the like. In another embodiment, the base substrate SUB may be a quartz substrate, a synthetic quartz substrate, a calcium fluoride substrate, a fluorine-doped ("F-doped") quartz substrate, a soda-lime glass substrate, a non-alkali glass substrate, the like, or a combination thereof.

A buffer layer (not illustrated) may be disposed on the base substrate SUB. The buffer layer may prevent diffusion of metal atoms or impurities from the base substrate SUB to an upper structure (e.g., the thin film transistor TFT, the light emitting element LD, or the like). The buffer layer may maintain substantially a uniform active layer ACT by controlling a heat transfer rate during a crystallization process for forming the active layer ACT. The buffer layer may serve to improve flatness of a surface of the base substrate SUB in case that the surface of the base substrate SUB is not uniform. For example, the buffer layer may include an organic insulating material and/or an inorganic insulating material. In another embodiment, the buffer layer may be omitted.

The active layer ACT may be disposed on the base substrate SUB (or the buffer layer). The active layer ACT may include an oxide semiconductor, a silicon semiconductor, an organic semiconductor, or the like. For example, the oxide semiconductor may include indium (In), gallium (Ga), tin (Sn), zirconium (Zr), vanadium (V), hafnium (Hf), cadmium (Cd), germanium (Ge), chromium (Cr), titanium (Ti), zinc (Zn), the like, or a combination thereof. The silicon semiconductor may include amorphous silicon, polycrystalline silicon, or the like. The active layer ACT may include a source area, a drain area, and a channel area disposed between the source area and the drain area.

The gate insulating layer GI may be disposed on the active layer ACT and the base substrate SUB (or the buffer layer). The gate insulating layer GI may sufficiently cover the active layer ACT on the base substrate SUB (or the buffer layer), and may have a substantially flat upper surface without creating a step on the active layer ACT. In another embodiment, the gate insulating layer GI may cover the active layer ACT on the base substrate SUB (or the buffer layer) and may be disposed along a profile of the active layer ACT with a uniform thickness. A contact hole may be defined in the gate insulating layer GI. The contact hole may expose a portion of the active layer ACT. The gate insulating layer GI may include an inorganic insulating material. For example, the gate insulating layer GI may include a silicon compound, a metal oxide, or the like. For example, the silicon compound may include silicon oxide ($SiO_x$), silicon nitride ($SiN_x$), silicon oxynitride ($SiO_xN_y$), the like, or a combination thereof.

The gate electrode GE may be disposed on the gate insulating layer GI. The gate electrode GE may partially overlap the active layer ACT in a plan view. The gate electrode GE may include a metal, an alloy, a metal nitride, a conductive metal oxide, a transparent conductive material, or the like. For example, the gate electrode GE may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), the like, or a combination thereof.

The interlayer insulating layer ILD may be disposed on the gate electrode GE and the gate insulating layer GI. The interlayer insulating layer ILD may sufficiently cover the gate electrode GE on the gate insulating layer GI, and may have a substantially flat upper surface without creating a step on the gate electrode GE. In another embodiment, the interlayer insulating layer ILD may cover the gate electrode GE on the gate insulating layer GI and may be disposed along a profile of the gate electrode GE with a uniform thickness. A contact hole may be defined in the interlayer insulating layer ILD. The contact hole may expose a portion of the active layer ACT. The interlayer insulating layer ILD may include an inorganic insulating material. For example, the interlayer insulating layer ILD may include a silicon compound, a metal oxide, or the like.

The source electrode SE and the drain electrode DE may be disposed on the interlayer insulating layer ILD. Each of the source electrode SE and the drain electrode DE may be electrically connected to the active layer ACT through a contact hole formed in the interlayer insulating layer ILD and the gate insulating layer GI. Each of the source electrode SE and the drain electrode DE may include a metal, an alloy, a metal nitride, a conductive metal oxide, a transparent conductive material, the like, or a combination thereof.

Accordingly, the thin film transistor TFT including the active layer ACT, the gate insulating layer GI, the gate electrode GE, the interlayer insulating layer ILD, the source electrode SE, and the drain electrode DE may be configured.

The via insulating layer VIA may be disposed on the interlayer insulating layer ILD. For example, the via insulating layer VIA may be disposed on the interlayer insulating layer ILD with a relatively thick thickness to sufficiently cover the source electrode SE and the drain electrode DE. A contact hole may be defined in the via insulating layer VIA. The contact hole may expose a portion of the drain electrode DE. The via insulating layer VIA may include an organic insulating material, an inorganic insulating material, the like, or a combination thereof. In an embodiment, the via insulating layer VIA may include an organic insulating material. For example, the via insulating layer VIA may include a photoresist, a polyacryl-based resin, a polyimide-based resin, a polyamide-based resin, a siloxane-based resin, an acryl-based resin, an epoxy-based resin, the like, or a combination thereof.

The lower electrode AE may be disposed on the via insulating layer VIA. The lower electrode AE may be electrically connected to the drain electrode DE through a contact hole formed in the via insulating layer VIA. As a result, the lower electrode AE may be electrically connected to the thin film transistor TFT. The lower electrode AE may include a metal, an alloy, a metal nitride, a conductive metal oxide, a transparent conductive material, the like, or a combination thereof. For example, the lower electrode AE may be an anode electrode.

The pixel defining layer PDL may be disposed on the via insulating layer VIA. The pixel defining layer PDL may cover an edge of the lower electrode AE and may expose a portion of an upper surface of the lower electrode AE. The pixel defining layer PDL may include an organic insulating material, an inorganic insulating material, the like, or a combination thereof. The organic insulating material may be a photoresist, a polyacryl-based resin, a polyimide-based resin, an acryl-based resin, the like, or a combination thereof. In an embodiment, the pixel defining layer PDL may further include an inorganic material or an organic material including a light blocking material in black color or the like.

The light emitting layer EML may be disposed on the lower electrode AE exposed by the pixel defining layer PDL. The light emitting layer EML may include at least one of an organic light emitting material and a quantum dot. The organic light emitting material may include a low-molecular-weight organic compound, a high-molecular-weight organic compound, or the like. For example, the low-molecular-weight organic compound may include copper phthalocyanine, N-N'-diphenylbenzidine, tri-(8-hydroxy-quinoline)aluminum, the like, or a combination thereof. For example, the high-molecular-weight organic compound may include poly(3,4-ethylenedioxythiophene), polyaniline, poly-phenylenevinylene, polyfluorene, the like, or a combination thereof, but the disclosure is not limited thereto.

The upper electrode CE may be disposed on the pixel defining layer PDL and the light emitting layer EML. For example, the upper electrode CE may include a metal, an alloy, a metal nitride, a conductive metal oxide, a transparent conductive material, the like, or a combination thereof. For example, the upper electrode CE may be a cathode electrode. Accordingly, the light emitting element LD including the lower electrode AE, the light emitting layer EML, and the upper electrode CE may be configured.

The encapsulation layer TFE may be disposed on the upper electrode CE. The encapsulation layer TFE may prevent impurities, moisture, and the like from permeating to the light emitting element LD from an outside. The encapsulation layer TFE may include at least one inorganic encapsulation layer and at least one organic encapsulation layer. For example, the inorganic encapsulation layer may include silicon oxide, silicon nitride, silicon oxynitride, the like, or a combination thereof, and the organic encapsulation layer may include a polymer cured material such as polyacrylate or the like.

Although the display device DD of the disclosure is described as an organic light emitting display device ("OLED"), the disclosure is not limited thereto. In embodiments, the display device DD may include a liquid crystal display device ("LCD"), a field emission display device ("FED"), a plasma display device ("PDP"), an electrophoretic image display device ("EPD"), an inorganic light emitting display device ("ILED"), a quantum dot display device, or the like.

Figure 11:
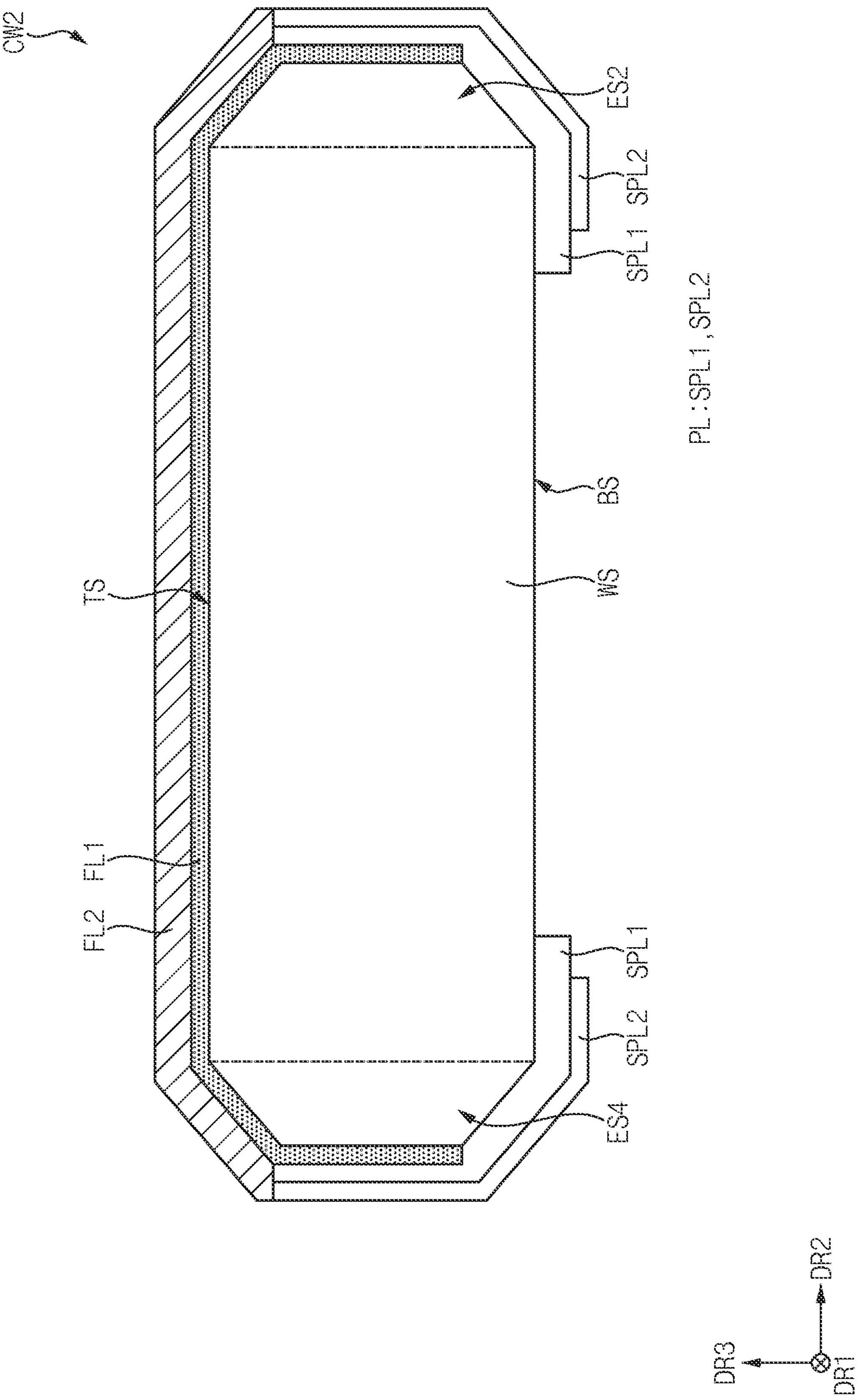
FIG. 11 is a schematic cross-sectional view illustrating a cover window according to another embodiment of the disclosure.

FIG. 11 is a schematic cross-sectional view illustrating a cover window CW2 according to another embodiment of the disclosure. Hereinafter, redundant descriptions of the cover window CW described with reference to FIG. 3 will be omitted or simplified, and the description will be focused on the fourth side surface area ES4 of the window substrate WS.

Referring to FIG. 11, a cover window CW2 according to another embodiment of the disclosure may include a window substrate WS, a first functional layer FL1, a second functional layer FL2, and a printed layer PL. The printed layer PL may include a first sub-printed layer SPL1 and a second sub-printed layer SPL2. For example, the first sub-printed layer SPL1 and the second sub-printed layer SPL2 may be stacked each other.

The first sub-printed layer SPL1 may be disposed to contact the second functional layer FL2 in the fourth side surface area ES4. The first sub-printed layer SPL1 may extend from the fourth side surface area ES4 to a portion of the rear surface area BS, and may be disposed on the window substrate WS in the rear surface area BS. For example, the first sub-printed layer SPL1 may cover a portion of the first functional layer FL1 in the fourth side surface area ES4. For example, the first sub-printed layer SPL1 may cover a portion the first functional layer FL1 on which the second functional layer FL2 is not disposed in the fourth side surface area ES4.

The second sub-printed layer SPL2 may be disposed to contact the second functional layer FL2 in the fourth side surface area ES4. The second sub-printed layer SPL2 may extend from the fourth side surface area ES4 to a portion of the rear surface area BS, and may be disposed on the first sub-printed layer SPL1 in the rear surface area BS. For example, the second sub-printed layer SPL2 may cover the first sub-printed layer SPL1 in the fourth side surface area ES4. The second sub-printed layer SPL2 may cover a portion of the first sub-printed layer SPL1 in the rear surface area BS. For example, a length of the second sub-printed layer SPL2 may be less than a length of the first sub-printed layer SPL1. Each of the first sub-printed layer SPL1 and the second sub-printed layer SPL2 may not be disposed on the second functional layer FL2. The first sub-printed layer SPL1 and the second sub-printed layer SPL2 may not overflow over the second functional layer FL2.

Although FIG. 11 illustrates that the printed layer PL includes two sub-printed layers SPL1 and SPL2, the disclosure is not limited thereto. In embodiments, the printed layer PL may have three or more sub-printed layers. For example, the printed layer PL may include multiple stacked sub-printed layers.

Figure 12:
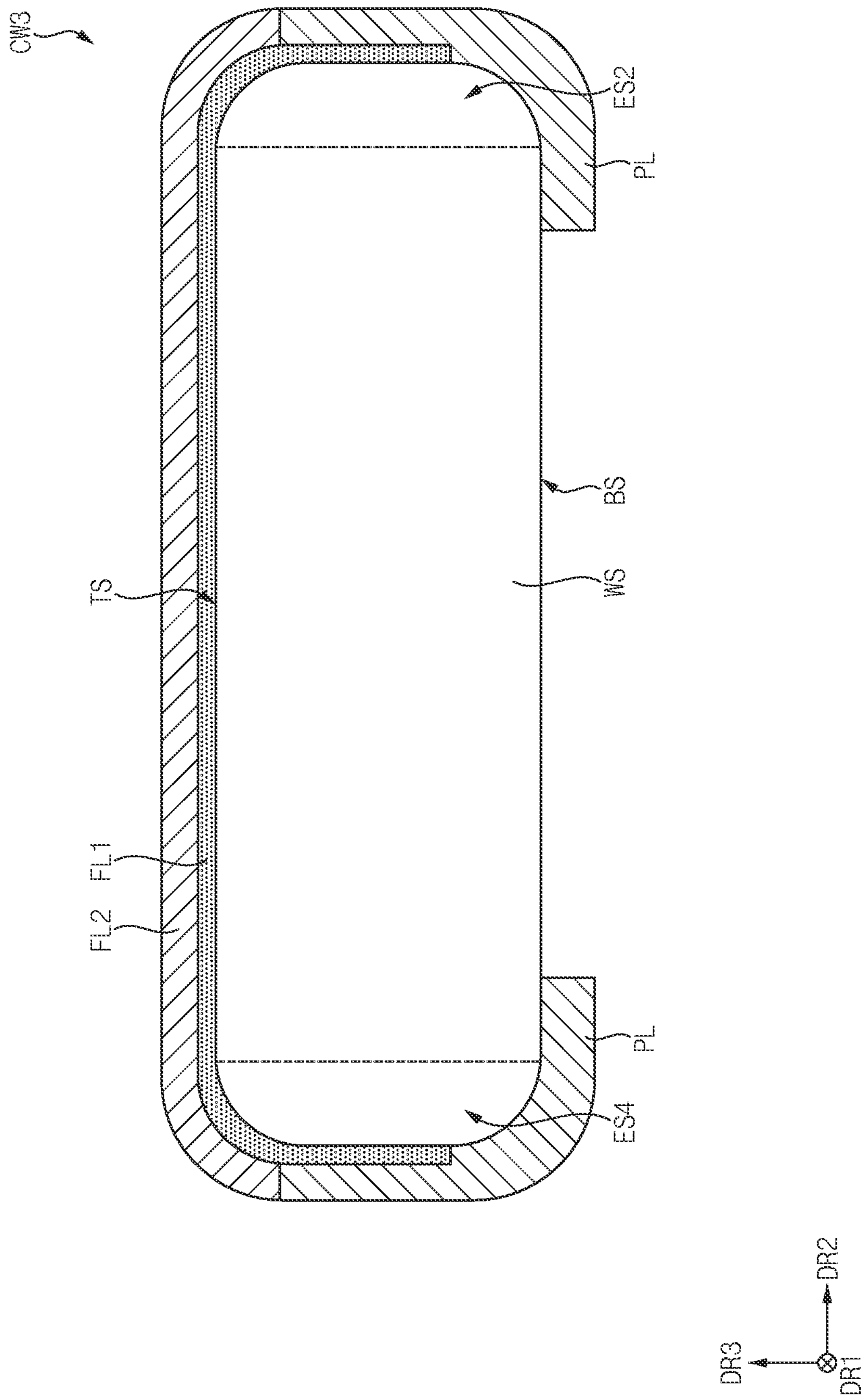
FIG. 12 is a schematic cross-sectional view illustrating a cover window according to another embodiment of the disclosure.

FIG. 12 is a schematic cross-sectional view illustrating a cover window CW3 according to another embodiment of the disclosure. Hereinafter, redundant descriptions of the cover window CW described with reference to FIG. 3 will be omitted or simplified, and the description will be focused on the fourth side surface area ES4 of a window substrate WS.

Referring to FIG. 12, a cover window CW3 according to another embodiment of the disclosure may include a window substrate WS, a first functional layer FL1, a second functional layer FL2, and a printed layer PL. The window substrate WS may include a front surface area TS, a rear surface area BS, a second side surface area ES2, and a fourth side surface area ES4.

The window substrate WS may include a curved surface in the fourth side surface area ES4 in a cross-sectional view. For example, a shape of the window substrate WS may be a rectangle with rounded corners in a cross-sectional view. The first functional layer FL1, the second functional layer FL2, and the printed layer PL may include a curved surface corresponding to the curved surface of the window substrate WS in the fourth side surface area ES4.

The disclosure can be applied to various display devices. For example, the disclosure is applicable to various display devices such as display devices for vehicles, ships, aircraft, and the like, portable communication devices, display devices for exhibition or information transmission, medical display devices, and the like.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A cover window comprising:
a window substrate including:
a front surface area;
a plurality of side surface areas surrounding the front surface area; and
a rear surface area facing the front surface area;
a first functional layer covering the front surface area of the window substrate and a portion of each of the plurality of side surface areas of the window substrate;
a second functional layer covering the first functional layer in the front surface area and a portion of the first functional layer in the plurality of side surface areas; and
a printed layer extending from the plurality of side surface areas to a portion of the rear surface area, contacting the second functional layer in the plurality of side surface areas, and covering another portion of the first functional layer and the rear surface area of the window substrate.

2. The cover window of claim 1, wherein the first functional layer includes an inorganic material.

3. The cover window of claim 2, wherein the first functional layer includes at least one of $SiO_2$ and $Al_2O_3$.

4. The cover window of claim 1, wherein the second functional layer includes an anti-fingerprint coating layer.

5. The cover window of claim 1, wherein each of the first functional layer and the second functional layer has a uniform thickness.

6. The cover window of claim 1, wherein a thickness of the first functional layer is in a range of about 5 nanometers to about 30 nanometers.

7. The cover window of claim 1, wherein the printed layer does not extend to the front surface area.

8. The cover window of claim 1, wherein
the printed layer includes a plurality of sub-printed layers, and
the plurality of sub-printed layers are stacked on each other.

9. The cover window of claim 1, wherein the plurality of side surface areas of the window substrate include a curved surface in a cross-sectional view.

10. A display device comprising:
a cover window;
a display panel disposed under the cover window; and
an adhesive attaching the cover window to the display panel, wherein
the cover window comprises:
a window substrate including:
a front surface area;
a plurality of side surface areas surrounding the front surface area; and
a rear surface area facing the front surface area;
a first functional layer covering the front surface area of the window substrate and a portion of each of the plurality of side surface area of the window substrates;
a second functional layer covering the first functional layer in the front surface area and a portion of the first functional layer in the plurality of side surface areas; and
a printed layer extending from the plurality of side surface areas to a portion of the rear surface area, contacting the second functional layer in the plurality of side surface areas, and covering another portion of the first functional layer and the rear surface area of the window substrate, and
the adhesive covers at least a portion of the printed layer in the plurality of side surface areas and the rear surface area.

11. The display device of claim 10, wherein
the first functional layer includes at least one of $SiO_2$ and $Al_2O_3$, and
the second functional layer includes an anti-fingerprint coating layer.

12. The display device of claim 10, wherein the plurality of side surface areas of the window substrate include a curved surface in a cross-sectional view.

* * * * *